(12) United States Patent
Okuno et al.

(10) Patent No.: US 12,439,735 B2
(45) Date of Patent: Oct. 7, 2025

(54) SEMICONDUCTOR DEVICE AND METHOD FOR PRODUCING SEMICONDUCTOR DEVICE

(71) Applicants: TOYODA GOSEI CO., LTD., Kiyosu (JP); MEIJO UNIVERSITY, Nagoya (JP)

(72) Inventors: Koji Okuno, Kiyosu (JP); Koichi Mizutani, Kiyosu (JP); Masaki Oya, Kiyosu (JP); Kazuyoshi Iida, Kiyosu (JP); Satoshi Kamiyama, Nagoya (JP); Tetsuya Takeuchi, Nagoya (JP); Motoaki Iwaya, Nagoya (JP); Isamu Akasaki, Nagoya (JP)

(73) Assignee: Meijo University, Nagoya (JP)

( * ) Notice: Subject to any disclaimer, the term of this patent is extended or adjusted under 35 U.S.C. 154(b) by 764 days.

(21) Appl. No.: 17/581,256

(22) Filed: Jan. 21, 2022

(65) Prior Publication Data
US 2022/0246793 A1    Aug. 4, 2022

(30) Foreign Application Priority Data

Feb. 1, 2021    (JP) .................................. 2021-014671

(51) Int. Cl.
*H10H 20/813*    (2025.01)
*H10H 20/01*    (2025.01)
(Continued)

(52) U.S. Cl.
CPC .......... *H10H 20/813* (2025.01); *H10H 20/01* (2025.01); *H10H 20/0137* (2025.01); *H10H 20/812* (2025.01); *H10H 20/821* (2025.01)

(58) Field of Classification Search
CPC ....... H01L 33/08; H01L 33/007; H01L 33/18; H01L 33/0075; H01L 33/0095; H01L 33/06; H01L 33/24
See application file for complete search history.

(56) References Cited

U.S. PATENT DOCUMENTS 8,587,015 B2    11/2013  Aoyagi
2011/0140159 A1*   6/2011  Aoyagi .................. H01L 33/44
                                                257/E33.012
(Continued)

FOREIGN PATENT DOCUMENTS

CA    2813812 A1 *  9/2011  ........... H01L 29/207
CN    110148885 A *  8/2019  ......... H01S 5/18316
(Continued)

OTHER PUBLICATIONS

Japanese Office Action in JPA No. 2021-014671 issued on Aug. 6, 2024. with English translation thereof.

*Primary Examiner* — Mohammed Shamsuzzaman
(74) *Attorney, Agent, or Firm* — McGinn I.P.Law Group, PLLC

(57) ABSTRACT

To suppress current leakage between the semiconductor layer below the mask and the buried layer above the mask. To reduce the drive voltage and improve the emission efficiency by improving the efficiency of carrier injection into the active layer. The semiconductor light-emitting device includes a substrate, a mask, a columnar semiconductor, a buried layer, a cathode electrode, and an anode electrode. The substrate has a conductive substrate, an n-type semiconductor layer disposed on the conductive substrate, and a p-type semiconductor layer disposed on the n-type semiconductor layer. The p-type semiconductor layer has a high resistance, thereby enhancing insulation between the n-type semiconductor layer and the buried layer.

8 Claims, 7 Drawing Sheets

(51) Int. Cl.
   *H10H 20/812*   (2025.01)
   *H10H 20/821*   (2025.01)

(56)              References Cited

U.S. PATENT DOCUMENTS

2016/0307960 A1    10/2016   Dupont et al.
2017/0025575 A1*    1/2017   Zheng .................. H01L 33/145
2017/0148960 A1     5/2017   Dupont et al.
2018/0219143 A1     8/2018   Dupont et al.
2018/0323338 A1*   11/2018   Grundmann ............ H01L 33/32
2019/0013440 A1*    1/2019   Chowdhury ........ H01L 33/0075
2022/0246789 A1*    8/2022   Okuno ................ H01L 33/0008
2022/0285580 A1*    9/2022   Okuno ................... H01L 33/42

FOREIGN PATENT DOCUMENTS

JP         2004103754 A   *   4/2004    ............. H01L 33/44
JP         2010171167 A   *   8/2010    ............. H01L 33/44
JP         2011224749 A   *  11/2011    ............. H01L 33/44
JP         2019012744 A   *   1/2019    ............. H01L 33/44
JP         2019106494 A       6/2019
JP         2019-169735 A     10/2019
JP         2020-077817 A      5/2020
WO    WO-2011117056 A1   *   9/2011    ............. B82Y 20/00
WO    WO 2015/091212 A1       6/2015
WO    WO-2017009394 A1   *   1/2017    ..... H01L 31/035227
WO    WO-2018122358 A1   *   7/2018    ............. H01L 27/156
WO    WO-2020095840 A1   *   5/2020    ............. B82Y 20/00
WO    WO-2021168098 A1   *   8/2021    ............. H01L 33/04
WO    WO-2022264854 A1   *  12/2022    ............. B82Y 20/00

* cited by examiner

SEMICONDUCTOR DEVICE AND METHOD FOR PRODUCING SEMICONDUCTOR DEVICE

BACKGROUND OF THE INVENTION

Field of the Invention

The present techniques relate to a semiconductor device and a method for producing the semiconductor device.

Background Art

A semiconductor light-emitting device emits light through recombination of an electron with a hole in an active layer. Conventionally, a flat sheet structure has been used as an active layer. Recently, an active layer having a three-dimensional structure such as column has been studied.

For example, as disclosed in Patent Document 1, a semiconductor light-emitting device having a core shell type structure (multi-quantum shell; MQS) is known. In MQS, a semiconductor layer is a hexagonal columnar nanowire (NW), and an active layer is formed so as to cover the hexagonal column. The main surface of the active layer may be a m-plane. When the main surface is a m-plane, polarization does not occur, and there is no quantum-confined Stark effect (QCSE). Therefore, the internal quantum efficiency is expected to be improved.

Nanowire is formed by forming an n-type layer on a substrate, forming a dielectric mask having an opening (nano hole) with a diameter of nanometer order, and selectively growing semiconductor on the n-type layer exposed in the opening.

Patent Document 1 discloses a structure in which a buried semiconductor layer is filled in between nanowires. Patent Document 1 also discloses a structure in which a tunnel junction layer is formed on the side surface of the nanowire and a buried layer is of n-type. Since the n-type semiconductor has low resistance, the drive voltage can be more reduced than when the buried layer is of p-type.

Patent Document 1: Japanese Patent Application Laid-Open (kokai) No. 2020-77817

However, the present inventors have found that the following problem exists in the structure having a buried layer disposed on a mask as disclosed in Patent Document 1.

In terms of production, the thickness of the mask cannot be increased. When the mask is slightly cracked or the crystal is damaged because of thin mask, the insulation property of such a part is deteriorated, resulting in current leakage at that part. In Patent Document 1, current leakage may occur between the n-type layer below the mask and the buried layer above the mask. Especially, the higher the current density, the higher the risk of mask breakage. It is a problem.

SUMMARY OF THE INVENTION

The present techniques have been conceived for solving the aforementioned problem involved in conventional techniques. Thus, an object of the present techniques is to suppress current leakage between the semiconductor layer below the mask and the buried layer above the mask.

In a first aspect of the present invention, there is provided a semiconductor device comprising a first semiconductor layer, a second semiconductor layer formed on the first semiconductor layer and having a resistivity higher than that of the first semiconductor layer, a dielectric mask formed on the second semiconductor layer, a plurality of openings formed on the mask as holes having a depth reaching the first semiconductor layer, a plurality of columnar semiconductor formed on the first semiconductor layer of the openings, and a buried layer for filling in a space between columnar semiconductors.

In the semiconductor device according to the first aspect of the invention, the second semiconductor layer may be semiconductor having a conductivity type different from a conductivity type of the first semiconductor layer, or undoped semiconductor.

In the semiconductor device according to the first aspect of the invention, the buried layer may be semiconductor having the same conductivity type as that of the first semiconductor layer.

In the semiconductor device according to the first aspect of the invention, the thickness of the mask may be 2 nm to 50 nm.

In a second aspect of the present invention, there is provided a semiconductor device comprising a first n-type semiconductor layer, a tunnel junction layer formed on the first semiconductor layer, a second p-type semiconductor layer formed on the tunnel junction layer, a dielectric mask formed on the second semiconductor layer, a plurality of openings formed on the mask as holes having a depth reaching the second semiconductor layer, and a plurality of p-type columnar semiconductor formed on the second semiconductor layer of the openings.

In the semiconductor device according to the second aspect of the invention, a mesa may be further formed, and the tunnel junction layer and the second semiconductor layer may be exposed on the side surface of the mesa, or columnar semiconductor may be exposed on the side surface of the mesa.

In a third aspect of the present invention, there is provided a method for producing a semiconductor device, the method comprising a first step of depositing a first n-type semiconductor layer, a tunnel junction layer, and a second p-type semiconductor layer in order on a growth substrate, a second step of performing activation annealing for the tunnel junction layer and the second semiconductor layer after the first step, a third step of forming a dielectric mask having a plurality of openings on the second semiconductor layer after the second step, a fourth step of selectively growing p-type columnar semiconductor on the openings after the third step, a fifth step of forming a mesa so as to expose the tunnel junction layer and the second semiconductor layer on the side surface thereof after the fourth step, and a sixth step of performing activation annealing for the tunnel junction layer, the second semiconductor layer, and the columnar semiconductor after the fifth step.

In the specification, there is provided a semiconductor device which can suppress current leakage between the semiconductor layer below the mask and the buried layer above the mask.

BRIEF DESCRIPTION OF THE DRAWINGS

Various other objects, features, and many of the attendant advantages of the present techniques will be readily appreciated as the same becomes better understood with reference to the following detailed description of the preferred embodiments when considered in connection with the accompanying drawings, in which.

DETAILED DESCRIPTION OF PREFERRED EMBODIMENTS

Figure 1:
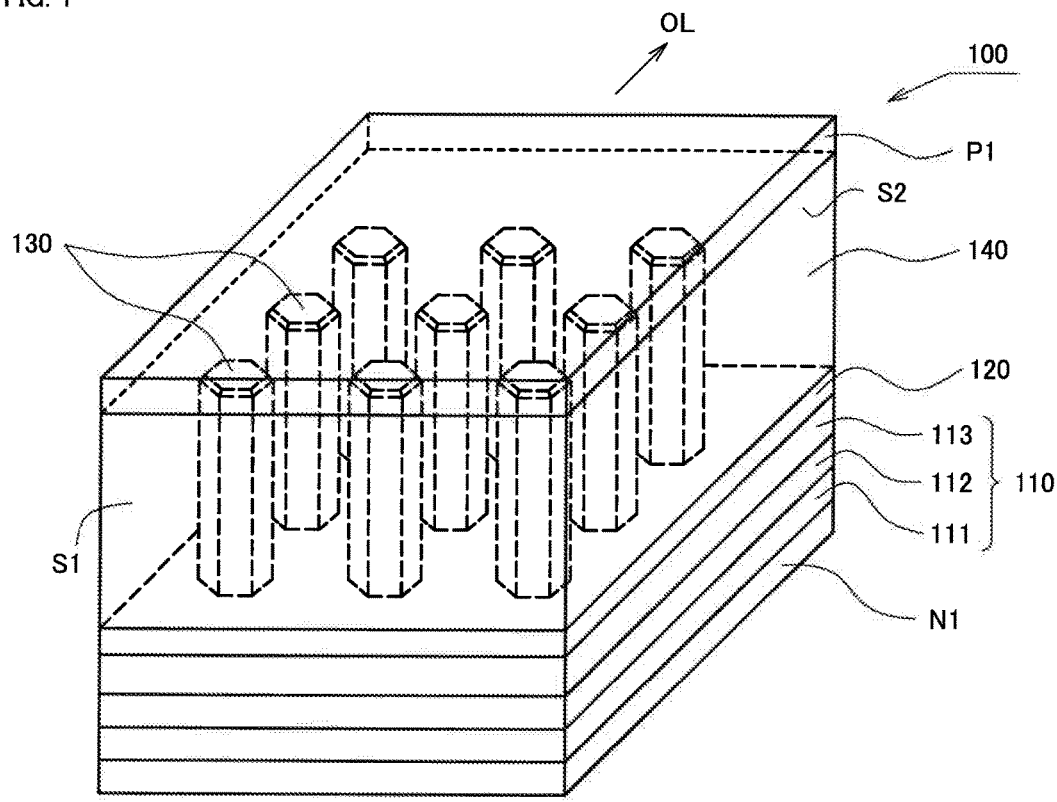
FIG. 1 is a perspective view showing the structure of a semiconductor light-emitting device 100 according to a first embodiment.

With reference to the drawings, specific embodiments of the semiconductor light-emitting device as examples will next be described in detail. However, these embodiments should not be construed as limiting the techniques thereto. The below-described depositing structure of the layers of the semiconductor light-emitting device and the electrode structure are given only for the illustration purpose, and other depositing structures differing therefrom may also be employed. The thickness of each of the layers shown in the drawings is not an actual value, but a conceptual value.

First Embodiment

1. Semiconductor Light-Emitting Device

Figure 2:
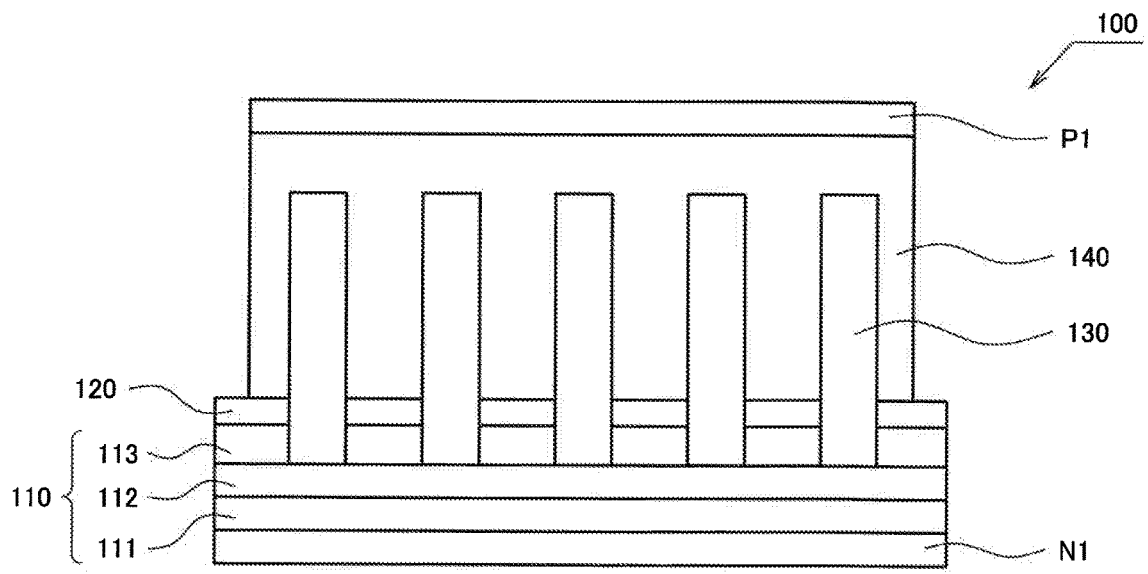
FIG. 2 is a cross-sectional view of the semiconductor light-emitting device 100 according to the first embodiment.

FIG. 1 is a perspective view showing the structure of a semiconductor light-emitting device 100 according to a first embodiment. FIG. 2 is a cross-sectional view of the semiconductor light-emitting device 100. As shown in FIGS. 1 and 2, the semiconductor light-emitting device 100 includes a substrate 110, a mask 120, a columnar semiconductor 130, a buried layer 140, a cathode electrode N1, and an anode electrode P1.

The substrate 110 is a growth substrate for growing the columnar semiconductor 130 and supporting the mask 120, the columnar semiconductor 130, and the buried layer 140. The substrate 110 includes a conductive substrate 111, an n-type semiconductor layer (first semiconductor layer) 112 disposed on the conductive substrate 111, and a p-type semiconductor layer (second semiconductor layer) 113 disposed on the n-type semiconductor layer 112.

The conductive substrate 111 is, for example, an n-type GaN substrate having a c-plane main surface, a Si substrate or a SiC substrate.

The n-type semiconductor layer 112 is, for example, a Si-doped n-type GaN layer. The thickness of the n-type semiconductor layer 112 is, for example, 1 μm to 5 μm.

The p-type semiconductor layer 113 is formed to enhance insulation between the n-type semiconductor layer 112 and the buried layer 140 because the mask 120 alone cannot secure sufficient insulation. The p-type semiconductor layer 113 is, for example, a Mg-doped p-type GaN layer. The p-type semiconductor layer 113 has a high resistance, thereby enhancing insulation between the n-type semiconductor layer 112 and the buried layer 140. The p-type semiconductor layer 113 has a through hole in the area of an opening 120a described later, and the n-type semiconductor layer 112 is exposed on the bottom thereof.

The thickness of the p-type semiconductor layer 113 is, for example, 2 nm to 100 nm. Within this range, insulation is sufficiently enhanced. The Mg concentration of the p-type semiconductor layer 113 is, for example, $1 \times 10^{18}$ cm$^{-3}$ to $1 \times 10^{21}$ cm$^{-3}$. Within this range, the p-type semiconductor layer 113 can have a sufficient high resistance.

The p-type semiconductor layer 113 preferably has a high resistance, and Mg may not be sufficiently activated. For example, the Mg activation rate may be not more than 0.5%.

An undoped semiconductor layer may be used instead of the p-type semiconductor layer 113. For example, an undoped GaN layer may be used. Moreover, instead of GaN, a material such as AlGaN having a band gap higher than that of the n-type semiconductor layer 112 may be used. In short, a semiconductor layer having a higher resistance than that of the n-type semiconductor layer 112 may be formed on the n-type semiconductor layer 112. For example, a layer having a resistivity one hundred times or higher than that of the n-type semiconductor layer 112, may be formed.

The mask 120 is made of a dielectric material inhibiting semiconductor growth on the surface thereof. As described later, the mask 120 has a through hole (opening 120a). A portion of the p-type semiconductor layer 113 corresponding to the opening 120a is removed, and the n-type semiconductor layer 112 is exposed in the opening 120a. The mask 120 may be a transparent insulating film. In this case, the mask 120 hardly absorbs light. The material of the mask 120 includes, for example, $SiO_2$, SiNx, and $Al_2O_3$.

The thickness of the mask 120 is, for example, 2 nm to 50 nm. The opening 120a having fine pattern needs to be formed in the mask 120 with high precision and low cost. Therefore, the opening 120a is formed using nanoimprinting as described later. As a result, the mask 120 is extremely thin. When the mask 120 has a little crack or pin hole, or crystal is damaged, weak insulation part is likely to occur. Current leakage occurs at such weak insulation part, and electrical conduction is established between the n-type semiconductor layer 112 and the buried layer 140. Therefore, sufficient insulation is secured by forming the above-mentioned p-type semiconductor layer 113 in addition to the mask 120 which alone cannot secure sufficient insulation.

As shown in FIGS. 1 and 2, the columnar semiconductor 130 is columnar Group III nitride semiconductor. The columnar semiconductor 130 is formed on the substrate 110. More specifically, the columnar semiconductor 130 is semiconductor selectively grown from the surface of the substrate 110 (the surface of the n-type semiconductor layer 112) exposed in the opening 120a of the mask 120. The columnar semiconductor 130 has a hexagonal columnar shape. The cross section perpendicular to the center axis direction of the columnar semiconductor 130, is a regular hexagon or a flat hexagon. The columnar semiconductor 130 is arranged in a square lattice. The columnar semiconductor 130 may be periodically arranged in a parallel lattice, a parallel lattice, a rectangular lattice, an orthorhombic lattice, a regular triangle lattice, and a honeycomb pattern other than a square lattice.

The columnar semiconductor 130 is preferably arranged along the crystal orientation of the n-type semiconductor layer 112. For example, when the columnar semiconductor 130 is arranged in a triangle lattice on a {0001} plane of the Group III nitride semiconductor with a wurtzite structure, the triangle lattice is preferably arranged along a crystal orientation (for example, m-axis or a-axis) of a base vector of a hexagonal unit cell of the Group III nitride semiconductor. On the other hand, when the columnar semiconductor 130 is arranged in a square lattice, that arrangement is twofold symmetrical, which is different from the symmetry of a {0001} plane of the Group III nitride semiconductor. In that case, one side of square lattice is preferably aligned with a crystal orientation of a base vector of a square unit cell of the Group III nitride semiconductor. By arranging the columnar semiconductor 130 along the crystal orientation of the n-type semiconductor layer 112, the buried layer 140 tends to be stably grown and easily fills in. Needless to say, the columnar semiconductor 130 may be arranged misaligned with or along a direction completely different from the crystal orientation of the n-type semiconductor layer 112.

The buried layer 140 is a layer for filling in a space between the columnar semiconductors 130. The buried layer 140 covers the columnar semiconductors 130. The surface of the buried layer 140 is flat. The buried layer 140 is made of, for example, Si-doped n-GaN. By forming the buried layer 140, the light extraction efficiency is improved.

The cathode electrode N1 is formed on the backside of the substrate 110 (the surface opposite to the surface on which the mask 120 is formed).

The anode electrode P1 is formed on the buried layer 140.

2. Columnar Semiconductor

Figure 3:
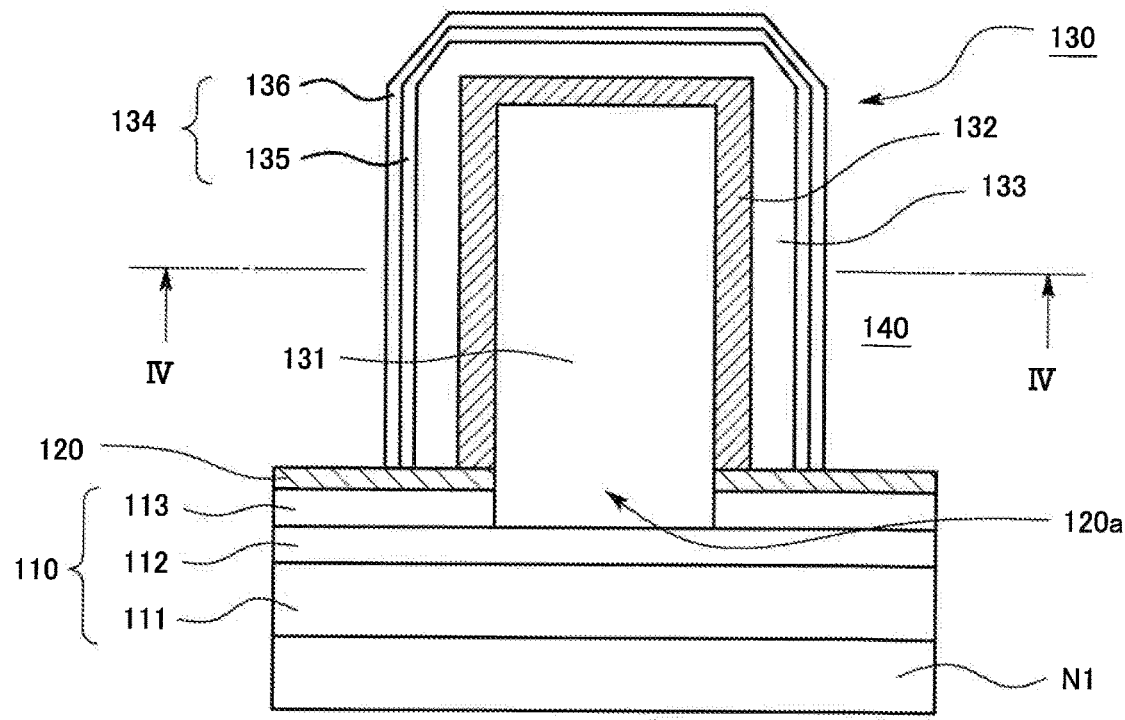
FIG. 3 shows the structure of columnar semiconductor 130.

FIG. 3 shows the structure of columnar semiconductor 130. As shown in FIG. 3, the columnar semiconductor 130 includes an n-type columnar semiconductor 131, an active layer 132, a p-type cylindrical semiconductor 133, and a tunnel junction layer 134. The side surface of the n-type columnar semiconductor 131 is a m-plane or a plane closer to the m plane. The m-plane is a non-polar surface.

Therefore, the reduction of the emission efficiency due to piezoelectric polarization is not observed in the active layer 132.

2-1. Structure of Columnar Semiconductor

The n-type columnar semiconductor 131 is a semiconductor layer selectively grown in a columnar shape from the surface of the n-type semiconductor layer 112 exposed in the opening 120a of the mask 120. The n-type columnar semiconductor 131 has a hexagonal columnar shape. The cross section perpendicular to the axial direction of this hexagonal column is a regular hexagon or a flat hexagon. Actually, the n-type columnar semiconductor 131 also slightly grows in a lateral direction. Therefore, the width of the n-type columnar semiconductor 131 is slightly larger than the width of the opening 120a of the mask 120. The n-type columnar semiconductor 131 is, for example, an n-type GaN layer.

The height of the n-type columnar semiconductor 131 is, for example, 0.25 µm to 5 µm. The diameter of the n-type columnar semiconductor 131 is, for example, 50 nm to 500 nm. Here, "diameter" refers to a diameter of the circle circumscribing the hexagon of the n-type columnar semiconductor 131. The distance between the n-type columnar semiconductors 131 (distance between the centers of adjacent columnar semiconductors 130) is, for example, 0.27 µm to 5 µm. These values are given as examples, and values falling outside the ranges may be employed.

The active layer 132 is formed along the outer periphery of the n-type hexagonal columnar semiconductor 131. Therefore, the active layer 132 has a hexagonal cylindrical shape. The active layer 132 includes, for example, one to five well layers, and barrier layers sandwiching the well layer. The well layer of the active layer 132 is almost perpendicular to the plate surface of the substrate 110. However, the top of the active layer 132 may cover the top of the n-type columnar semiconductor 131. The top of the active layer 132 may be almost parallel to the plate surface of the substrate 110. For example, the well layer is an InGaN layer, and the barrier layer is an AlGaInN layer.

The p-type cylindrical semiconductor 133 is formed along the outer periphery of the active layer 132 having a hexagonal cylindrical shape. Therefore, the p-type cylindrical semiconductor 133 has a hexagonal cylindrical shape. The p-type cylindrical semiconductor 133 is directly in contact with the active layer 132, but is not directly in contact with the n-type columnar semiconductor 131. The p-type cylindrical semiconductor 133 is, for example, a p-type GaN layer. An electron barrier layer may be formed between the active layer 132 and the p-type cylindrical semiconductor 133. The electron barrier layer is p-type semiconductor with a band gap larger than that of the p-type cylindrical semiconductor 133, for example, p-AlGaInN. By forming the electron barrier layer, electrons can be confined efficiently in the active layer 132, thereby improving the emission efficiency.

The tunnel junction layer 134 is formed along the outer periphery of the p-type cylindrical semiconductor 133. Therefore, the tunnel junction layer 134 has a hexagonal cylindrical shape. The tunnel junction layer 134 has a p+ type layer 135 and an n+ type layer 136. The p+ type layer 135 is disposed between the p-type cylindrical semiconductor 133 and the n+ type layer 136. The p+ type layer 135 is a layer having a high p-type impurity concentration, for example, p-GaN. The Mg concentration of the p+ type layer 135 is, for example, $2 \times 10^{20}$ cm$^{-3}$. The n+ type layer 136 is a layer having a high n-type impurity concentration, for example, n-GaN. The Si concentration of the n+ type layer 136 is, for example, $4 \times 10^{20}$ cm$^{-3}$. Electrical conduction can be established by forming the tunnel junction layer 134 and making the buried layer 140 made of n-GaN.

The tunnel junction layer 134 may be omitted and the buried layer 140 may be made of p-GaN. However, when the buried layer 140 is made of n-GaN as in the first embodiment, conductivity can be more improved than when the buried layer 140 is made of p-GaN. Moreover, when the buried layer 140 is of the same n-type with the n-type semiconductor layer 112, the effect of forming the p-type semiconductor layer 113 is great as in the first embodiment. When the n-type semiconductor layer 112 and the buried layer 140 are both of n-type, barrier for electrical conduction is larger than when the buried layer 140 is of p-type. Therefore, insulation between the n-type semiconductor layer 112 and the buried layer 140 is increased.

2-2. Cross-Sectional Shape

Figure 4:
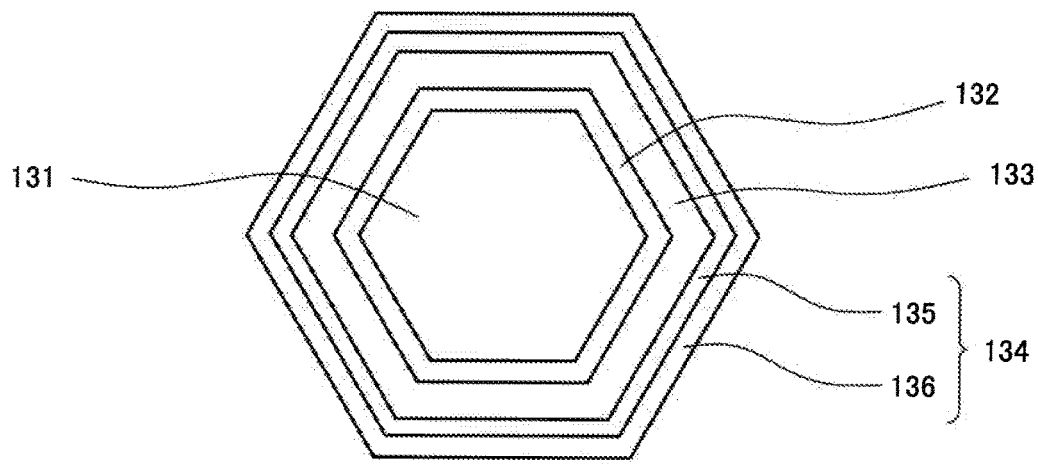
FIG. 4 is a view showing the cross section IV-IV of FIG. 3.

FIG. 4 is a view showing the cross section IV-IV of FIG. 3. FIG. 4 shows a cross section parallel to the plate surface of the substrate 110 in the columnar semiconductor 130. As shown in FIG. 4, the cross section perpendicular to the axial direction in the columnar semiconductor 130 is a regular hexagon. The n-type columnar semiconductor 131, the active layer 132, the p-type cylindrical semiconductor 133, and the tunnel junction layer 134 are disposed in this order inside the hexagonal columnar semiconductor 130. The cross section perpendicular to the axial direction in the columnar semiconductor 130 may not be a regular hexagon, but may be a flat hexagon.

Figure 5:
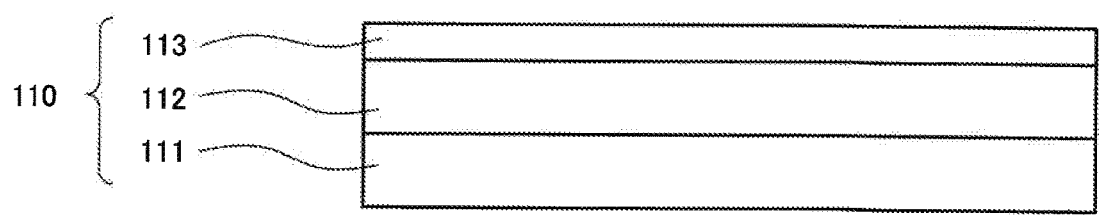
FIG. 5 is a view explaining a method for producing the semiconductor light-emitting device according to the first embodiment.

3. Method for Producing Semiconductor Light-Emitting Device 3-1. Preparing Substrate As shown in FIG. 5, a growth substrate 111 is prepared. Subsequently, an n-type semiconductor layer 112, and a p-type semiconductor layer 113 are sequentially deposited on the growth substrate 111 through MOCVD. Hereinafter, MOCVD is used to form a semiconductor layer.

3-2. Forming Mask

Figure 6:
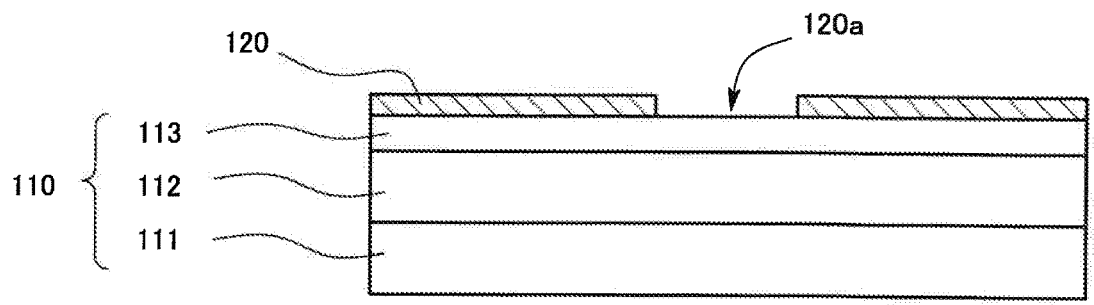
FIG. 6 is a view explaining the method for producing the semiconductor light-emitting device according to the first embodiment.

As shown in FIG. 6, a mask 120 is formed on the n-type semiconductor layer 112. In FIG. 6, an opening 120a is drawn, which is formed in forming opening described below.

3-3. Forming Opening

Figure 7:
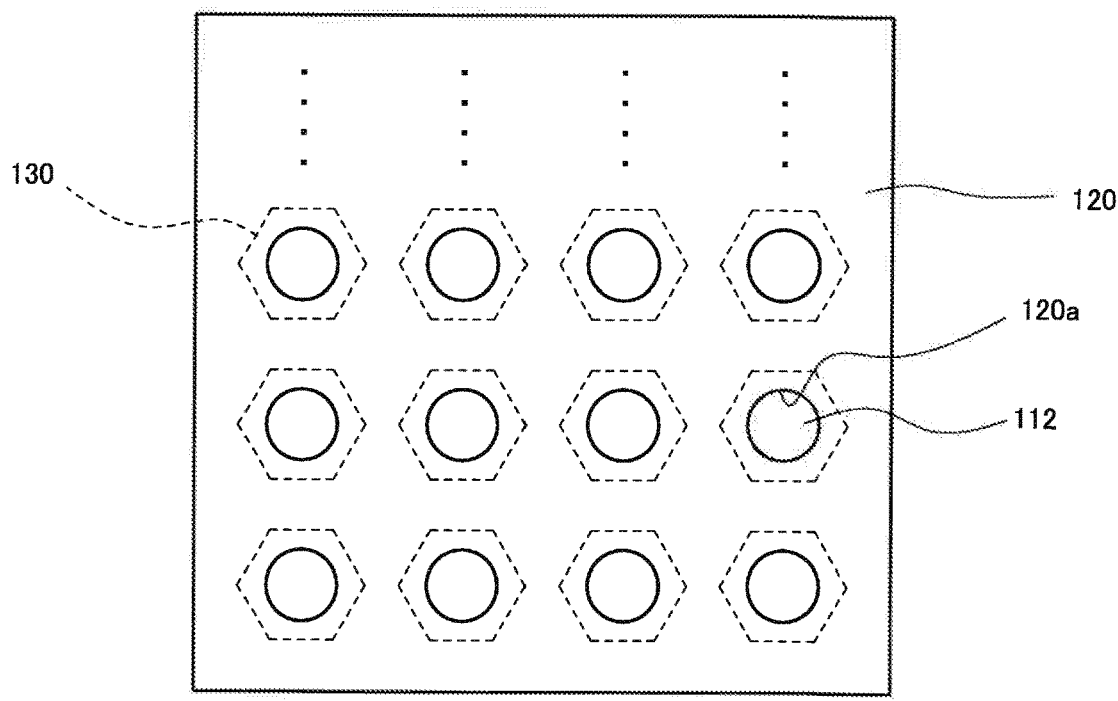
FIG. 7 is a view explaining the method for producing the semiconductor light-emitting device according to the first embodiment.

As shown in FIG. 7, a plurality of openings 120a is formed to expose the n-type semiconductor layer 112 in the mask 120. Nanoimprinting is used for patterning the mask 120. The diameter of the opening 120a is, for example, 100 nm to 500 nm. FIG. 7 shows the arrangement of the openings 120a in the mask 120. FIG. 7 is a view of the substrate 110 viewed from a direction perpendicular to the plate surface of the substrate 110. In FIG. 7, the shape of the columnar semiconductor 130 is drawn in a dotted line for reference. As shown in FIG. 7, the openings 120a of the mask 120 are circular and arranged in a square lattice.

By changing the shape of the opening 120a of the mask 120, the shape of the columnar semiconductor 130 can be controlled. When the shape of the opening 120a is circular, the columnar semiconductor 130 having a cross sectional shape close to a regular hexagon can be formed. When the shape of the opening 120a is oval, the columnar semiconductor 130 having a cross sectional shape close to a flat hexagon can be formed.

3-4. Removing p-Type Semiconductor Layer 113

Figure 8:
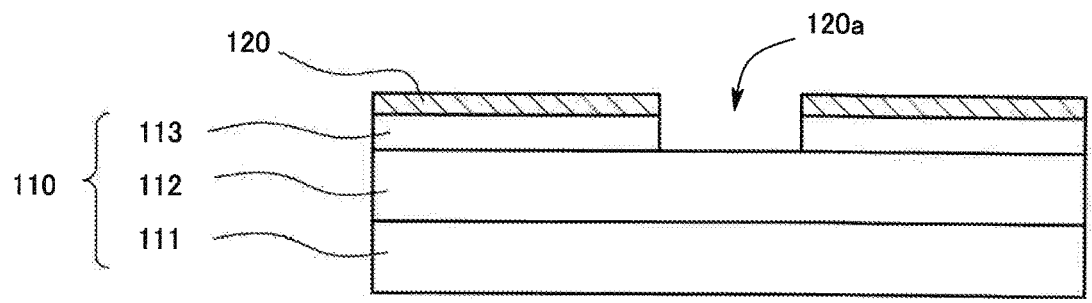
FIG. 8 is a view explaining the method for producing the semiconductor light-emitting device according to the first embodiment.

Next, as shown in FIG. 8, the n-type semiconductor layer 112 is exposed by removing the p-type semiconductor layer 113 exposed in the opening 120a through etching. Thermal etching is used.

Or, the n-type semiconductor layer 112 may be exposed by further promoting etching without stopping etching when the p-type semiconductor layer 113 was exposed in the previous step of forming an opening 120a using nanoimprinting.

3-5. Forming Columnar Semiconductor

Figure 9:
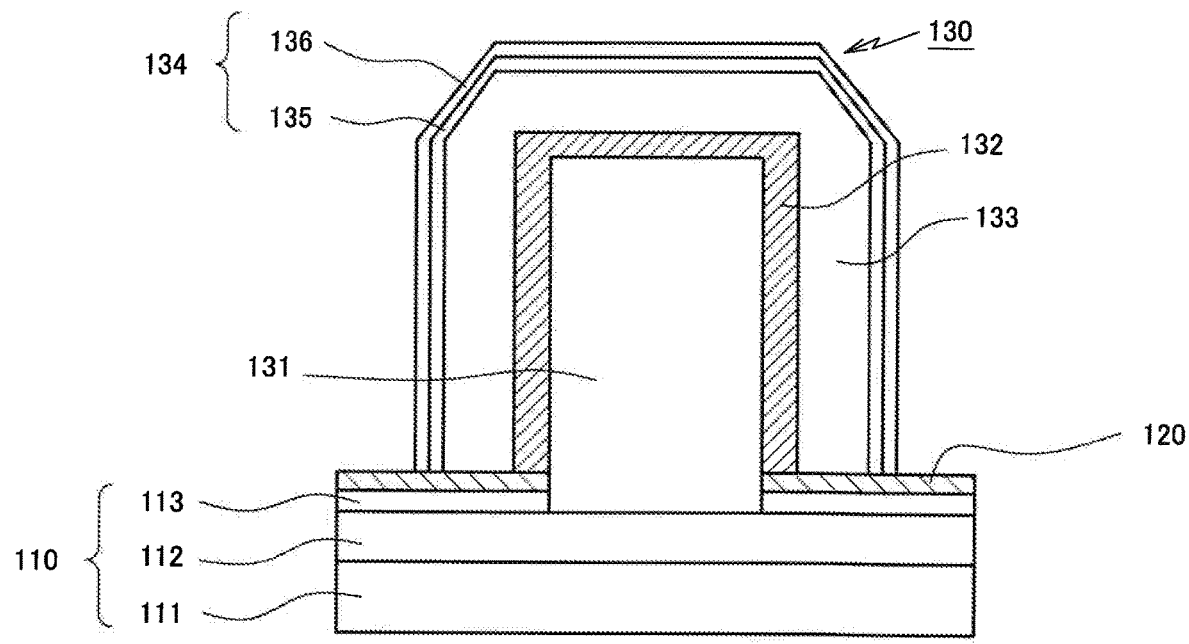
FIG. 9 is a view explaining the method for producing the semiconductor light-emitting device according to the first embodiment.

As shown in FIG. 9, a columnar semiconductor 130 is formed. Firstly, an n-type hexagonal columnar semiconductor 131 is selectively grown from the n-type semiconductor layer 112 exposed under the opening 120a of the mask 120. The known selective growth technique may be used. When a semiconductor layer is selectively grown in this way, a m-plane is easily exposed as a facet plane.

As described above, since the opening 120a of the mask 120 is circular, the n-type hexagonal columnar semiconductor 131 having a cross sectional shape close to a regular hexagon is grown.

An active layer 132 is formed around the n-type columnar semiconductor 131. The active layer 132 is formed on the side surface of the n-type columnar semiconductor 131 having a cross sectional shape close to a regular hexagon. The active layer 132 is also formed on the top of the n-type columnar semiconductor 131.

A p-type cylindrical semiconductor 133 covering the outer periphery of the active layer 132 on the active layer 132. The p-type cylindrical semiconductor 133 has a hexagonal cylindrical shape. The p-type cylindrical semiconductor 133 is formed on the side of the active layer 132. The p-type cylindrical semiconductor 133 is also formed on the top of the active layer 132.

A p+ type layer 135 covering the p-type cylindrical semiconductor 133 is formed on the p-type cylindrical semiconductor 133, and an n+ type layer 136 covering the p+ type layer 135 is formed. In this way, a tunnel junction layer 134 is formed. The tunnel junction layer 134 is formed on the side surface of the p-type cylindrical semiconductor 133. The tunnel junction layer 134 is also formed on the top of the p-type cylindrical semiconductor 133. Thus, the columnar semiconductor 130 is formed.

3-6. Forming Buried Layer

Figure 10:
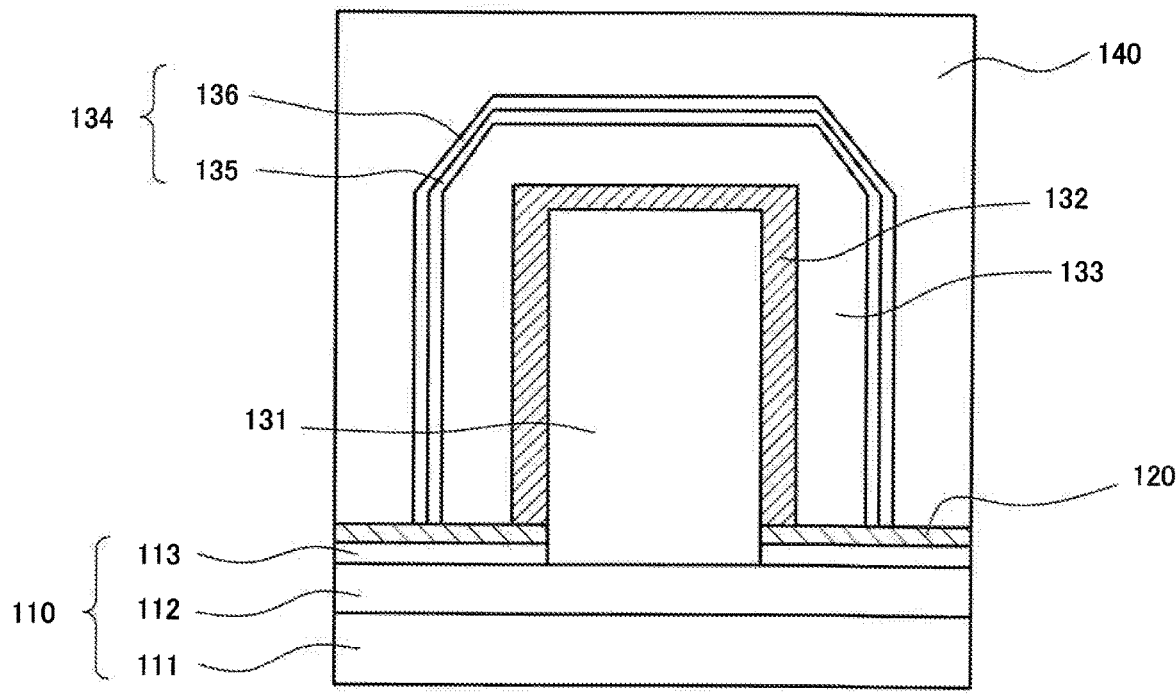
FIG. 10 is a view explaining the method for producing the semiconductor light-emitting device according to the first embodiment.

As shown in FIG. 10, a space between the columnar semiconductors 130 is filled with a buried layer 140.

3-7. Forming Electrode

Subsequently, a cathode electrode N1 is formed on the backside of the substrate 110. An anode electrode P1 is formed on the buried layer 140. In this way, the semiconductor light-emitting device 100 according to the first embodiment shown in FIGS. 1 and 2 is produced.

3-8. Other Steps

In addition to the aforementioned steps, additional steps such as a step of a heat treatment step and forming a passivation film on the surface of the semiconductor layer may be carried out.

4. Effect of First Embodiment

In the first embodiment, the p-type semiconductor layer 113 is formed on the n-type semiconductor layer 112. Thereby, insulation between the n-type semiconductor layer 112 of the substrate 110 and the buried layer 140 on the mask 120 can be enhanced. Therefore, current leakage via the p-type semiconductor layer 113 can be suppressed, and the efficiency of carrier injection into the active layer 132 can be improved, thereby reducing the drive voltage and improving the emission efficiency.

5. Variations 5-1. Element Structure of Semiconductor Light-Emitting Device

The semiconductor light-emitting device according to the first embodiment has a vertical structure which establishes electrical conduction in a direction perpendicular to the main surface of the substrate 110 by forming a cathode electrode N1 on the backside of the substrate 110. However, the semiconductor light-emitting device may have a flip-chip type or a face-up type structure, in which a cathode electrode N1 is formed on the same side as the anode electrode P1. In that case, etching is performed from the top surface of the buried layer 140 to expose the n-type semiconductor layer 112, and a cathode electrode N1 is formed on thus exposed n-type semiconductor layer 112.

5-2. Composition of Columnar Semiconductor

In the first embodiment, the n-type columnar semiconductor 131 is an n-type GaN layer, the well layer of the active layer 132 is an InGaN layer, the barrier layer of the active layer 132 is an AlGaInN layer, and the p-type cylindrical semiconductor 133 is a p-type GaN layer. These are examples, and the layers may be other Group III nitride semiconductors or other semiconductors.

5-3. Surface Layer

A plurality of protrusions may be formed to extract light on the surface of the buried layer 140. A surface layer may be formed on the buried layer 140, or a plurality of protrusions may be formed on the surface layer. The surface layer is, for example, an n-GaN layer having a doping amount different from that of the buried layer 140. The surface layer may be made of transparent conductive oxide such as ITO and IZO. The protrusions are arranged, for example, in a honeycomb pattern or a square lattice. Or, recesses instead of protrusions may be formed.

5-4. Composition of Buried Layer

In the first embodiment, the buried layer 140 is an n-GaN layer. However, an n-AlGaN layer may be used instead of n-GaN layer as the buried layer 140. The buried layer 140 may be made of a combination of n-GaN and n-AlGaN. In case of a laser diode, light confinement can be enhanced due to refractive index difference by forming n-AlGaN on n-GaN.

5-5. Current Blocking Layer of Columnar Semiconductor

The amount of current supply from the side surface of the columnar semiconductor 130 is preferably increased. For example, a transparent insulating film is formed on the top of the columnar semiconductor 130. The current flowing to the top of the columnar semiconductor 130 is blocked, thereby properly increasing the amount of current supply from the side surface of the columnar semiconductor 130.

5-6. Uneven Patterned Substrate

When the semiconductor light-emitting device is used as a LED, an uneven pattern may be formed on the growth substrate 111 of the substrate 110. That is, the growth substrate 111 has an uneven part in which protrusions and recesses are periodically arranged on the semiconductor layer side of the substrate. An uneven part has, for example, a conical shape or a hemispherical shape. These protrusions are preferably arranged, for example, in a square lattice or a honeycomb pattern. Thereby, the light extraction efficiency is further improved.

5-7. Application to Other Semiconductor Device

The first embodiment is a semiconductor light-emitting device. When a light-emitting device of the first embodiment is employed as a laser having the structure shown in FIG. 1, the end surfaces S1 and S2 are formed into mirror surfaces. A space between the mirror end surfaces S1 and S2 makes a cavity. Laser is output from the end surface S2 in a OL direction. However, it is applicable to a device other than the light-emitting device, for example, a light-receiving device such as solar battery.

5-8. Combinations

The aforementioned variations may be combined with one another without any restriction.

Second Embodiment

1. Semiconductor Light-Emitting Device

Figure 11:
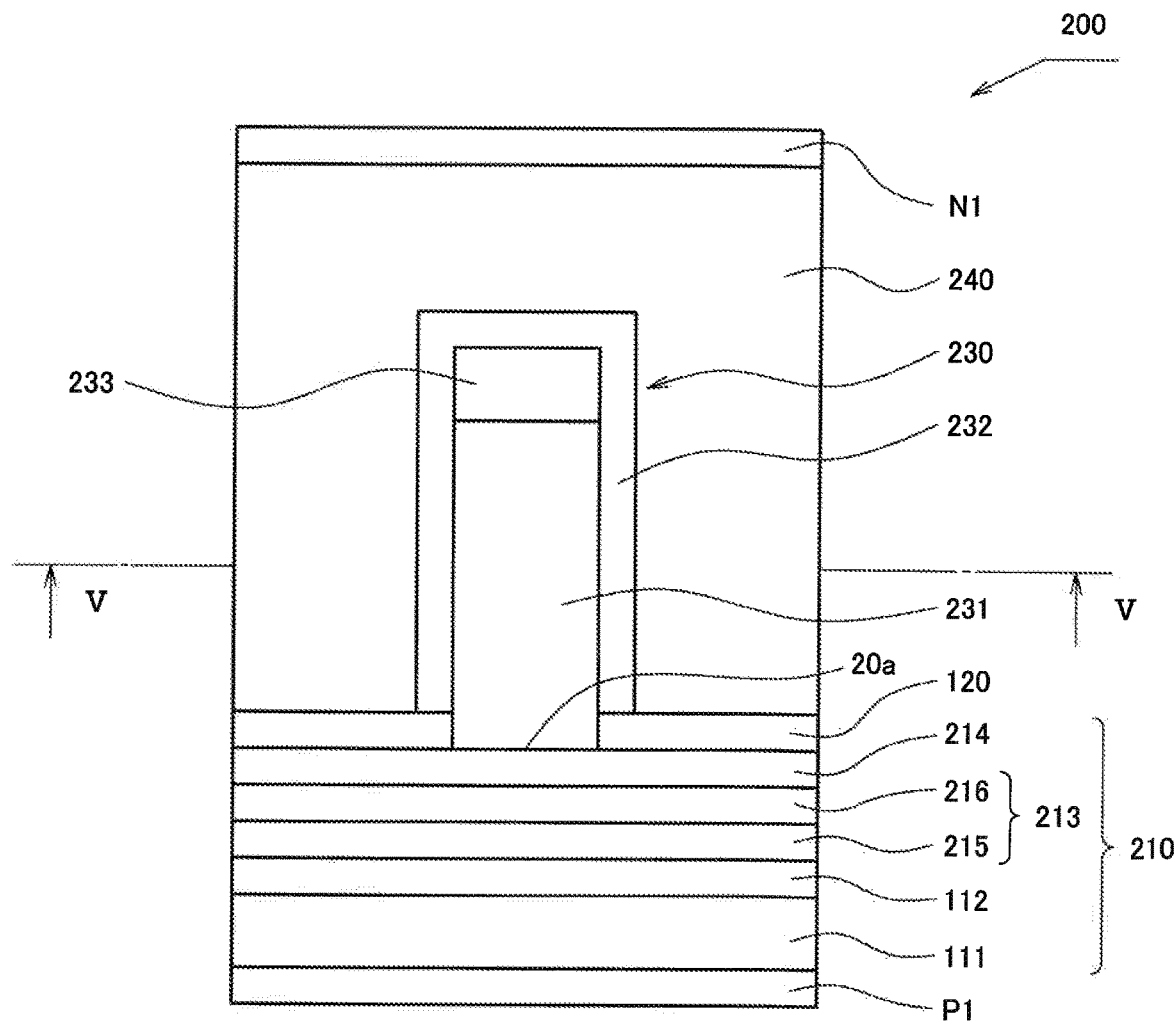
FIG. 11 is a cross-sectional view of a semiconductor light-emitting device according to a second embodiment.

FIG. 11 is a cross-sectional view showing the vicinity of a columnar semiconductor 230 of a semiconductor light-emitting device 200 according to a second embodiment. As shown in FIG. 11, the semiconductor light-emitting device 200 includes a substrate 210, a mask 120, a columnar semiconductor 230, a buried layer 240, a cathode electrode N1, and an anode electrode P1.

The substrate 210 is a growth substrate for growing the columnar semiconductor 230 thereon and supporting the mask 120, the columnar semiconductor 230, and the buried layer 240. The substrate 210 includes a conductive substrate 111, an n-type semiconductor layer 112 disposed on the conductive substrate 111, a tunnel junction layer 213 disposed on the n-type semiconductor layer 112, and a p-type semiconductor layer 214 disposed on the tunnel junction layer 213. The conductive substrate 111 and the n-type semiconductor layer 112 are the same as in the first embodiment.

The tunnel junction layer 213 has a structure in which an n+ type layer 215 and a p+ type layer 216 are sequentially deposited on the n-type semiconductor layer 112. The n+ type layer 215 is a layer having a high n-type impurity concentration, for example, made of n-GaN. The p+ type layer 216 is a layer having a high p-type impurity concentration, for example, made of p-GaN. The thickness and the impurity concentration of the n+ type layer 215 and the p+ type layer 216 are set so as to form a tunnel junction between the n-type semiconductor layer 112 and the p-type semiconductor layer 214. The p+ type layer 216 is a tunnel layer.

The p-type semiconductor layer 214 is, for example, a Mg-doped p-type GaN layer. The thickness of the p-type semiconductor layer 214 is, for example, 50 nm to 500 nm. The Mg concentration of the p-type semiconductor layer 214 is, for example, $5\times10^{18}$ cm$^{-3}$ to $5\times10^{20}$ cm$^{-3}$.

The mask 120 is the same as in the first embodiment except for that the mask 120 is formed on the p-type semiconductor layer 214.

The columnar semiconductor 230 is columnar Group III nitride semiconductor. The columnar semiconductor 230 is semiconductor selectively grown on the surface of the substrate 110 exposed in the opening 120a of the mask 120 (the surface of the p-type semiconductor layer 214). The shape and arrangement of the columnar semiconductor 230 are the same as the columnar semiconductor 130 in the first embodiment.

The buried layer 240 is the same as in the first embodiment.

The anode electrode P1 is formed on the backside of the substrate 210 (the surface opposite to the surface on which the mask 120 is formed).

The cathode electrode N1 is formed on the buried layer 240.

2. Columnar Semiconductor

The columnar semiconductor 230 has a p-type columnar semiconductor 231, an active layer 232, and an undoped semiconductor 233 as shown in FIG. 11. The side surface of the p-type columnar semiconductor 231 is a m-plane or a surface close to a m-plane, and the emission efficiency is hardly reduced due to piezoelectric polarization in the active layer 232.

2-1. Structure of Columnar Semiconductor

The p-type columnar semiconductor 231 is a semiconductor layer selectively grown in a columnar shape from the surface of the p-type semiconductor layer 214 exposed in the opening 120a of the mask 120. The p-type columnar semiconductor 231 is, for example, a p-type GaN layer. The p-type columnar semiconductor 231 has the same shape as that of the n-type columnar semiconductor 131 in the first embodiment.

The undoped semiconductor 233 is disposed on the top end of the p-type columnar semiconductor 231. The undoped semiconductor 233 is, for example, an undoped GaN layer. By forming the undoped semiconductor 233, a current is prevented from flowing out from the top end of the columnar semiconductor 230, and the amount of current supply to the side surface of the columnar semiconductor 230 is increased. The undoped semiconductor may be a layer having a high resistance by codoping Mg and Si.

The active layer 232 is formed along the outer periphery of the p-type hexagonal columnar semiconductor 231 and the undoped semiconductor 233. Other structure is the same as that of the active layer 132 in the first embodiment.

An electron barrier layer may be formed between the p-type columnar semiconductor 231 and the active layer 232. The electron barrier layer is p-type semiconductor having a bandgap larger than that of the p-type columnar semiconductor 231, for example, p-AlGaInN. By forming the electron barrier layer, electrons are efficiently confined in the active layer 232, thereby improving the emission efficiency.

2-2. Cross Sectional Shape

Figure 12:
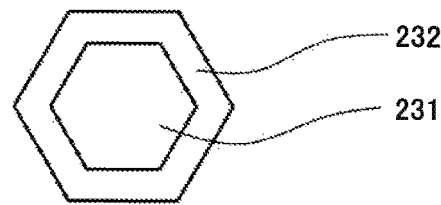
FIG. 12 is a view showing the cross section V-V of FIG. 11.

FIG. 12 is a view showing the cross section V-V of FIG. 11. FIG. 12 shows a cross section parallel to the plate surface of the substrate 210 in the columnar semiconductor 230. As shown in FIG. 12, the shape of the cross section perpendicular to the axial direction in the columnar semiconductor 230 is a regular hexagon. The p-type columnar semiconductor 231 and the active layer 232 are disposed inside the hexagonal columnar semiconductor 230. The shape of the cross section perpendicular to the axial direction in the columnar semiconductor 230 is not necessarily a regular hexagon, and may be a flat hexagon.

Figure 13:
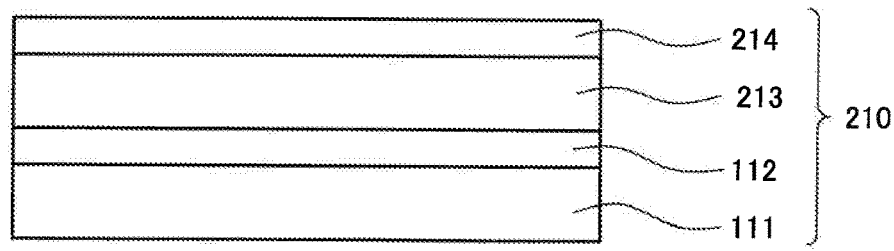
FIG. 13 is a view explaining a method for producing the semiconductor light-emitting device according to the second embodiment.

3. Method for Producing Semiconductor Light-Emitting Device 3-1. Preparing Substrate As shown in FIG. 13, a growth substrate 111 is prepared. An n-type semiconductor layer 112, a tunnel junction layer 213, and a p-type semiconductor layer 214 are sequentially deposited on the growth substrate 111 through MOCVD. Hereinafter, MOCVD is always employed to form a semiconductor layer. Annealing is performed to activate the p+ type layer 216 of the tunnel junction layer 213 and the p-type semiconductor layer 214. Annealing can be performed without considering thermal damage before the active layer 232 is formed. In this way, a substrate 210 is prepared to form the columnar semiconductor 230 thereon.

3-2. Forming Mask and Opening

Figure 14:
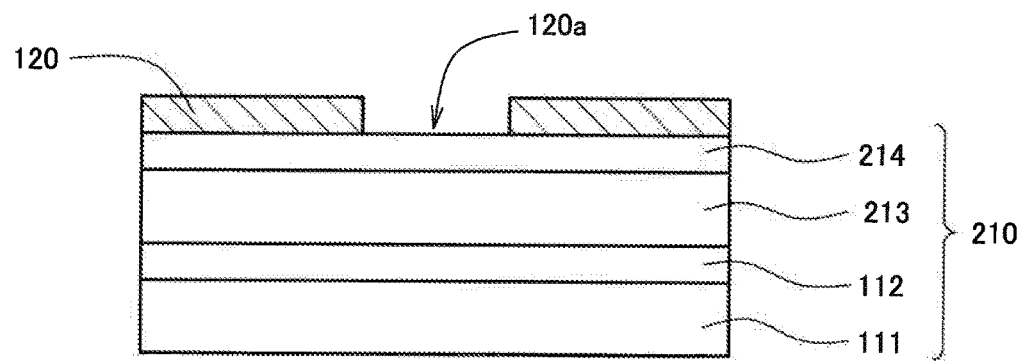
FIG. 14 is a view explaining the method for producing the semiconductor light-emitting device according to the second embodiment.

As shown in FIG. 14, a mask 120 is formed on the p-type semiconductor layer 214, and a plurality of the openings 120a is formed in the mask 120 to expose the p-type semiconductor layer 214 in the same way as in the first embodiment. Activation annealing may be performed after the mask 120 was formed.

3-3. Forming Columnar Semiconductor

Figure 15:
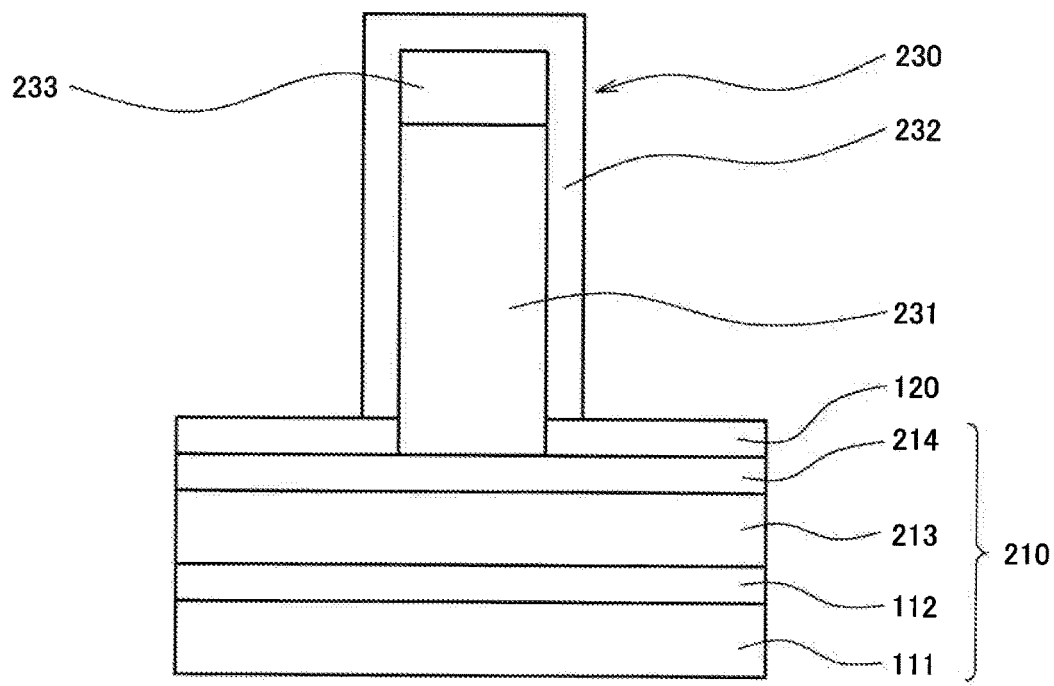
FIG. 15 is a view explaining the method for producing the semiconductor light-emitting device according to the second embodiment.

As shown in FIG. 15, a columnar semiconductor 230 is formed. Firstly, a p-type hexagonal columnar semiconductor 231 is selectively grown from the p-type semiconductor layer 214 exposed in the opening 120a of the mask 120. The supply of Mg dopant gas is stopped, and an undoped semiconductor 233 is formed at the top end of the p-type hexagonal columnar semiconductor 231. For that, a well-known selective growth technique may be employed. When a semiconductor layer is selectively grown in this way, a m-plane is easily exposed as a facet plane.

As described above, since the opening 120a of the mask 120 has a circular shape, a p-type hexagonal columnar semiconductor 231 having a cross sectional shape close to a regular hexagon is grown.

Subsequently, an active layer 232 is formed around the p-type columnar semiconductor 231 and the undoped semiconductor 233. The active layer 232 is formed on the side surface of the p-type columnar semiconductor 231 having a cross sectional shape close to a regular hexagon. The active layer 232 is formed on the top surface and the side surface of the undoped semiconductor 233. In this way, the columnar semiconductor 230 is formed.

3-4. Forming Buried Layer

Figure 16:
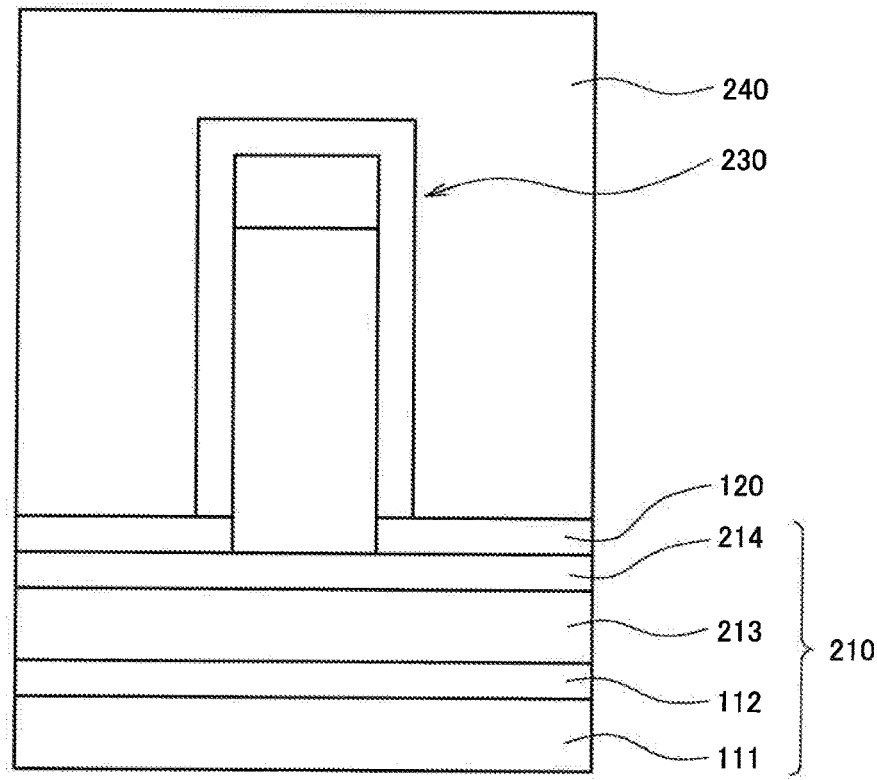
FIG. 16 is a view explaining the method for producing the semiconductor light-emitting device according to the second embodiment.

As shown in FIG. 16, a space between the columnar semiconductors 230 is filled with a buried layer 240. The buried layer 240 is grown until the surface thereof becomes flat.

3-5. Forming Mesa

Figure 17:
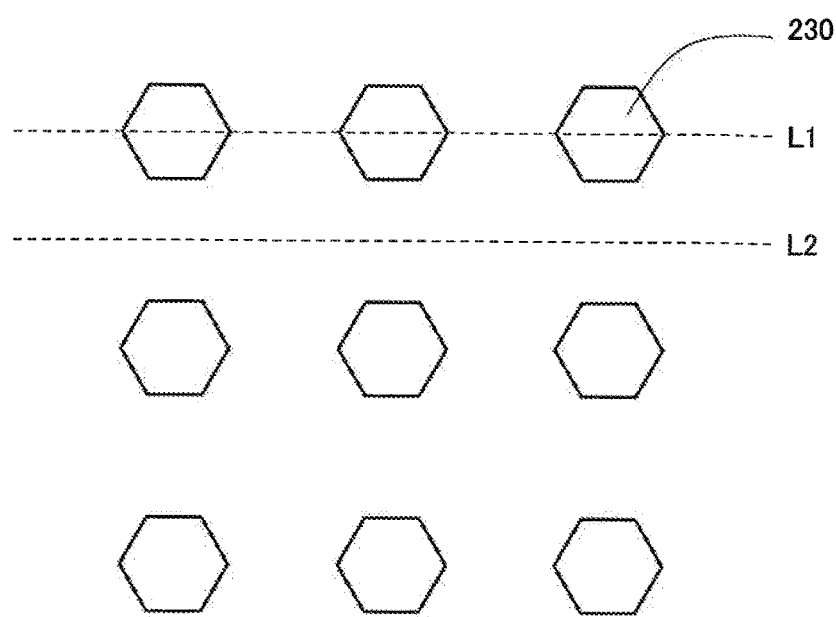
FIG. 17 is a view showing a line of a side surface of mesa.

A mesa for element separation is formed so as to expose the junction layer 213 or the p-type semiconductor layer 214 on the side surface thereof. Activation annealing is performed. Since the tunnel junction layer 213 or the p-type semiconductor layer 214 is exposed on the side surface of the mesa, hydrogen removal is promoted, thereby efficiently achieving p-type conduction. When the semiconductor light-emitting device 200 is a LED, line L1 of the side surface of the mesa is preferably along the square lattice, and passes through the columnar semiconductor 230 (refer to FIG. 17). Since the p-type columnar semiconductor 231 of the columnar semiconductor 230 is exposed on the side surface of the mesa, the p-type columnar semiconductor 231 can efficiently have p-type conduction. When the semiconductor light-emitting device 200 is a laser diode, line L2 of the side surface of the mesa is preferably along the square lattice of the columnar semiconductor 230, and does not pass through the columnar semiconductor 230 so as not to affect resonance of laser light. For example, the line L2 preferably passes through the face center of the square lattice.

3-6. Forming Electrode

Subsequently, an anode electrode P1 is formed on the backside of the substrate 210. Moreover, a cathode electrode N1 is formed on the buried layer 240. In this way, a semiconductor light-emitting device 200 according to the second embodiment shown in FIG. 11 is produced.

3-7. Other Steps

In addition to the aforementioned steps, additional steps such as a step of a heat treatment step and forming a passivation film on the surface of the semiconductor layer may be carried out.

4. Effect of Second Embodiment

In the structure in which the trunk of the columnar semiconductor is of n-type and the columnar semiconductor is filled with the p-type semiconductor, the drive voltage is high because the buried layer is thick and the p-type semiconductor has high resistance. Therefore, the structure has been developed, in which a tunnel junction layer is formed on the side surface of the columnar semiconductor, and the buried layer is made of n-type semiconductor as in the first embodiment. Since the n-type semiconductor has low resistance, the drive voltage can be reduced more than that when the buried layer is of p-type.

However, since the columnar semiconductor or the p-type semiconductor of the tunnel junction layer is surrounded by the buried layer, the p-type semiconductor is difficult to be activated. As a result, the efficiency of carrier injection is reduced.

A semiconductor light-emitting device 200 according to a second embodiment is provided for solving the aforementioned problem. In the second embodiment, the tunnel junction layer 213 is formed on the substrate 210 side, and activation annealing can be performed before the active layer 232 is formed. Therefore, the p+ type layer 216 of the tunnel junction layer 213, the p-type semiconductor layer 214 and the p-type columnar semiconductor 231 can be efficiently activated in the tunnel junction layer 213. Moreover, activation annealing can be efficiently performed by forming a mesa after the active layer 232 was formed. By performing activation annealing before and after the active layer 232 is formed, annealing time after the active layer 232 was formed, can be shortened, thereby suppressing thermal damage to the active layer 232.

In this way, in the semiconductor light-emitting device 200 according to the second embodiment, the p-type semiconductors 231, 214, and 216 can be efficiently activated, thereby improving the efficiency of carrier injection. Since the buried layer 240 is of n-type, the p-type semiconductor can be made as thin as possible and the drive voltage can be improved. By performing activation annealing twice, thermal damage to the active layer 232 can be suppressed.

Moreover, in the semiconductor light-emitting device 200 according to the second embodiment, there is an advantage of easily setting the tunnel junction layer 213. When the tunnel junction layer is formed on the side surface of the columnar semiconductor, the thickness or the impurity concentration of the tunnel junction layer needed to be changed according to the diameter or the height of the columnar semiconductor. However, in the semiconductor light-emitting device 200 according to the second embodiment, the thickness or the impurity concentration of the tunnel junction layer 213 can be set regardless of the diameter or the height of the columnar semiconductor 230 because the tunnel junction layer 213 is formed on the substrate 210 side.

The semiconductor device of the specification can be employed as a light emitting such as a laser diode or a LED or a light receiving device such as a solar battery.

What is claimed is:

1. A semiconductor device comprising:
   a first n-type semiconductor layer;
   a tunnel junction layer formed on the first n-type semiconductor layer;
   a second p-type semiconductor layer formed on the tunnel junction layer;
   a dielectric mask formed on the second p-type semiconductor layer;
   a plurality of openings formed on the dielectric mask as holes having a depth reaching the second p-type semiconductor layer; and
   a plurality of p-type columnar semiconductor formed on the second p-type semiconductor layer of the openings,
   wherein a mesa is further formed, and the tunnel junction layer and the second p-type semiconductor layer are exposed on a side surface of the mesa, further comprising:
   a buried layer comprising an n-type semiconductor for filling in a space between the plurality of p-type columnar semiconductors, and
   wherein the mesa is a trench for separating elements.

2. The semiconductor device according to claim 1, wherein the columnar semiconductor is exposed on a side surface of the mesa.

3. A semiconductor device comprising:
   a semiconductor layer of a first type;
   a tunnel junction layer formed on the semiconductor layer of a first type;
   a semiconductor layer of a second type formed on the tunnel junction layer;
   a dielectric mask formed on the semiconductor layer of the second type;
   a plurality of openings formed on the dielectric mask as holes having a depth reaching the semiconductor layer of the second type; and
   a plurality of columnar semiconductor of a second type of semiconductor formed on the semiconductor layer of the second type of the openings,
   wherein a mesa is further formed, and the tunnel junction layer and the semiconductor layer of the second type are exposed on a side surface of the mesa, further comprising:
   a buried layer comprising a semiconductor of a first type for filling in a space between the plurality of columnar semiconductors of the second type semiconductor, and
   wherein the mesa is a trench for separating elements.

4. The semiconductor device according to claim 3, wherein the columnar semiconductor is exposed on a side surface of the mesa.

5. The semiconductor device according to claim 3, wherein the semiconductor layer of the second type is semiconductor having a conduction type different from a conduction type of the semiconductor layer of the first type.

6. The semiconductor device according to claim 3, wherein a thickness of the dielectric mask is 2 nm to 50 nm.

7. The semiconductor device according to claim 3, wherein the semiconductor layer of the second type is undoped semiconductor.

8. The semiconductor device according to claim 3, wherein the buried layer is semiconductor having a same conduction type as that of the semiconductor layer of the first type.

* * * * *